(12) United States Patent
Marin et al.

(10) Patent No.: US 11,804,420 B2
(45) Date of Patent: Oct. 31, 2023

(54) CORE-SHELL PARTICLES FOR MAGNETIC PACKAGING

(71) Applicant: INTEL CORPORATION, Santa Clara, CA (US)

(72) Inventors: Brandon Marin, Chandler, AZ (US); Whitney Bryks, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1073 days.

(21) Appl. No.: 16/020,122

(22) Filed: Jun. 27, 2018

(65) Prior Publication Data

US 2020/0006203 A1 Jan. 2, 2020

(51) Int. Cl.
*H01L 23/492* (2006.01)
*H01L 23/532* (2006.01)
*H01L 23/498* (2006.01)
*H01L 21/02* (2006.01)

(52) U.S. Cl.
CPC ...... *H01L 23/4922* (2013.01); *H01L 23/4924* (2013.01); *H01L 23/49822* (2013.01); *H01L 23/49894* (2013.01); *H01L 21/02112* (2013.01); *H01L 23/5329* (2013.01)

(58) Field of Classification Search
CPC ......... H01L 21/02175; H01L 21/02112; H01L 23/5329; H01L 23/49894
See application file for complete search history.

(56) References Cited

U.S. PATENT DOCUMENTS

| | | | | |
|---|---|---|---|---|
| 5,705,540 A * | 1/1998 | Uchida | .................. | C08L 63/00 523/210 |
| 7,598,578 B2 * | 10/2009 | Nakamura | .............. | G11C 11/16 257/E43.001 |
| 7,906,376 B2 * | 3/2011 | Swaminathan | ....... | H01L 21/563 257/E23.101 |
| 9,257,217 B2 * | 2/2016 | Yoshikawa | ............... | H01F 5/00 |
| 9,265,158 B2 * | 2/2016 | Mano | ................. | H01F 17/0033 |
| 2008/0135956 A1 * | 6/2008 | Huber | ..................... | H01F 1/083 428/209 |
| 2013/0082368 A1 * | 4/2013 | Kim | .................... | H01L 23/3135 257/659 |
| 2017/0306221 A1 * | 10/2017 | Koole | .................... | B29C 64/10 |

* cited by examiner

*Primary Examiner* — Mark W Tornow
*Assistant Examiner* — Abbigale A Boyle
(74) *Attorney, Agent, or Firm* — Schwabe, Williamson & Wyatt, P.C.

(57) ABSTRACT

A package substrate may include a build-up layer. The build-up layer may include a dielectric material and one or more microspheres. The one or more microspheres may include a magnetic core that includes a first material that is a first oxidation-resistant material. Further, the one or more microspheres may include a shell to encapsulate the core, and the shell may include a second material that is a second oxidation-resistant material. The package substrate may further include a metal layer coupled with the build-up layer.

7 Claims, 4 Drawing Sheets

CORE-SHELL PARTICLES FOR MAGNETIC PACKAGING

TECHNICAL FIELD

Embodiments of the present disclosure generally relate to the field of integrated circuit packages, and, more particularly, to core-shell particles for magnetic packaging.

BACKGROUND

The demand for enhanced performance and functionality of integrated circuit (IC) components continues to increase design and fabrication complexity. The substrates designed for these components may be manufactured with multiple layers of copper on dielectric material. The widths of copper traces are continually shrinking, which impacts the adhesion of copper to the dielectric material. Certain materials, such as, for example, iron, may be used to provide the dielectric material with properties that aid the adhesion of copper to the dielectric material.

A technique that may be used to promote the adhesion of copper to the dielectric material is desmear. Desmear may involve a sweller to prepare a substrate surface for oxidation, an oxidizing agent such as permanganate or chromate to promote micro-roughness by oxidizing polar species on the surface and near the surface of the dielectric, and a neutralizer to remove any reaction by-products or solvents from the previous operations and de-swell the matrix. However, chemistries used for desmear may dissolve materials used to provide the dielectric material with properties that aid adhesion.

BRIEF DESCRIPTION OF THE DRAWINGS

Embodiments will be readily understood by the following detailed description in conjunction with the accompanying drawings. To facilitate this description, like reference numerals designate like structural elements or components. Embodiments are illustrated by way of example and not by way of limitation in the figures of the accompanying drawings.

FIG. 1A illustrates a package substrate that includes a build-up layer and a metal layer;

FIG. 1B illustrates the build-up layer of the package substrate in FIG. 1A; and

FIG. 1C illustrates the package substrate of FIG. 1A that includes a build-up layer that includes filler material.

DETAILED DESCRIPTION

Figure 1A:
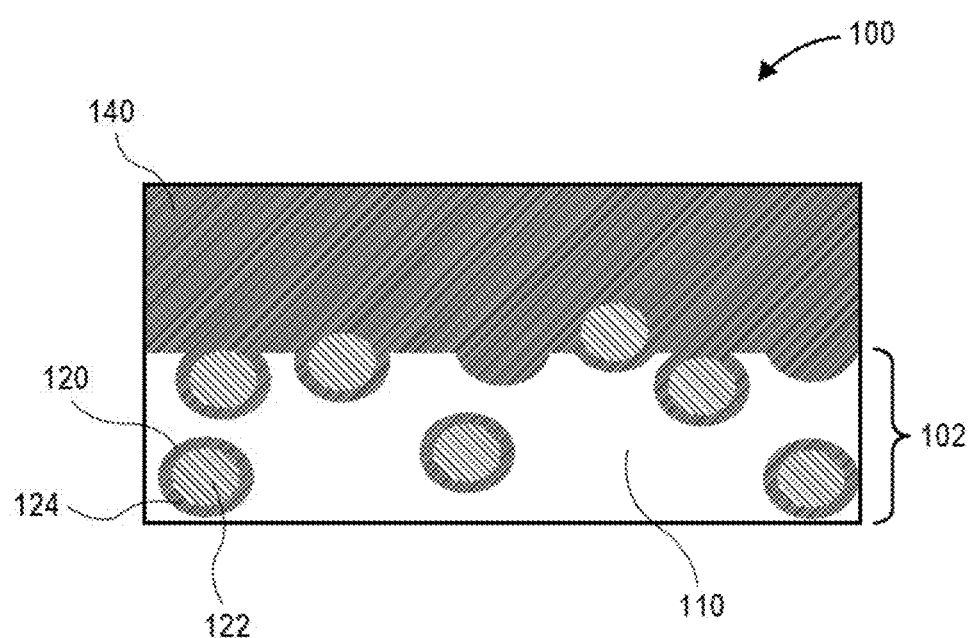
FIGS. 1A, 1B, and 1C illustrate cross-sectional views of a package substrate, in accordance with various embodiments, where.

Core-shell particles for magnetic packaging is described. The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc., in order to provide a thorough understanding of the various aspects of the claimed embodiments. However, it will be apparent to those skilled in the art having the benefit of the present disclosure that the various aspects of the embodiments claimed may be practiced in other examples that depart from these specific details. In certain instances, descriptions of well-known devices, circuits, integrated circuit design layouts, and methods are omitted or simplified so as not to obscure the description of embodiments of the present disclosure with unnecessary detail. Furthermore, it is to be understood that the various embodiments shown in the Figures are illustrative representations and are not necessarily drawn to scale. For example, the thickness of substrates, layers, regions, etc., may be exaggerated for clarity. Further, it is to be understood that the various embodiments shown in the Figures may include elements that are present but may be hidden from view in a particular Figure or Figures.

Various aspects of the illustrative embodiments may be described using terms commonly employed by those skilled in the art to convey the substance of their work to others skilled in the art. However, it will be apparent to those skilled in the art that alternate embodiments may be practiced with only some of the described aspects. For purposes of explanation, specific numbers, materials, and configurations may be set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

The phrase "in an embodiment," "in embodiments," "in various embodiments," "in some embodiments," and the like are used repeatedly. The phrase generally does not refer to the same embodiments; however, it may, and thus may refer to one or more of the same or different embodiments. The terms "comprising," "having," and "including" are synonymous, unless the context dictates otherwise. The phrase "A or B" means (A), (B), or (A and B).

The following description may use certain terminology for the purpose of reference only, and thus are not intended to be limiting. For example, perspective-based descriptions such as "upper", "lower", "above", and "below", and "under" may refer to directions in the drawings to which reference is made. For another example, terms such as "front", "back", "top", "bottom", "rear", and "side" may describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import. Such descriptions are merely used to facilitate the discussion and are not intended to restrict the application of embodiments described herein to any particular orientation.

The term "coupled with" or "coupled to," along with their derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

It will be understood that when an element/feature, such as, for example, a layer, region, or substrate, is referred to as being "on" another element/feature or surface of another element/feature, it may be directly on the other element/feature or surface of the element/feature, or intervening elements/features may also be present. Further, it will be understood that when the element/feature is referred to as being "on" another element/feature or surface of another element/feature, it may be "on" the other element/feature or surface of the other element/feature regardless of whether the elements/features are in a vertical orientation, a horizontal orientation, or an angled orientation. Further, to say that a first element/feature is formed, deposited, or otherwise disposed on or otherwise on, a second element/feature, may mean that the first element/feature is formed, deposited, or disposed over the second element/feature or surface of the second element/feature, and at least a part of the first element/feature may be in direct contact (e.g., direct physical and/or electrical contact) or indirect contact (e.g., having one or more other elements/features between the first element/feature and the second element/feature) with at least a part of the second element/feature. Further, the terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Various operations may be described as multiple discrete operations, in turn, in a manner that is most helpful in understanding the illustrative embodiments; however, the order of description should not be construed as to imply that these operations are necessarily order dependent. In particular, these operations need not be performed in the order of presentation. Further, example embodiments may be described as a process or operation flow depicted as a flowchart, a flow diagram, a data flow diagram, a structure diagram, or a block diagram. Although a flowchart may describe the operations as a sequential process or operation flow, many of the operations may be performed in parallel, concurrently, or simultaneously. In addition, the order of the operations may be re-arranged. A process or operation flow may be terminated when its operations are completed, but may also have additional operations not included in the figure(s). A process or operation flow may correspond to a method, a function, a procedure, a subroutine, a subprogram, and the like. When a process or operation flow corresponds to a function, its termination may correspond to a return of the function to the calling function and/or the main function.

Iron particles may be used to provide magnetic properties to dielectric material in an IC package substrate, which may also be referred to as a package substrate. Due to an oxidation-reduction, or redox, chemical reaction that is intrinsic to iron, the iron particles may oxidize when the dielectric material is introduced to various chemical wet baths during certain manufacturing processes, such as, for example, but not limited to, a desmear process. As the iron particles oxidize, the magnetic properties of the dielectric material may be reduced, which may impact the ability of a metal layer to adhere to the dielectric material. Further, filler particles found in dielectric materials may be composed of materials that may have poor adhesion to metal, such as, for example, but not limited to, copper, that may be deposited on the dielectric material. Accordingly, it may be challenging to obtain chemical compatibility between particles that may be used to provide magnetic properties, the polymeric system into which the particles may be embedded, and the reactive chemical baths to which the particles may be exposed during processing.

Figure 1B:
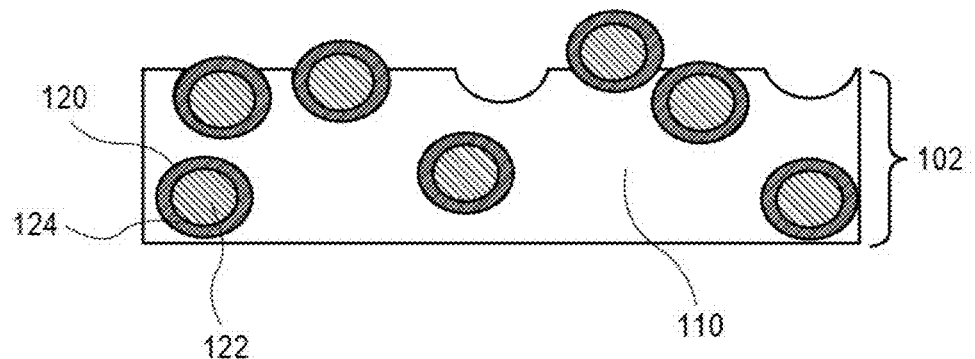
Figure 1C:
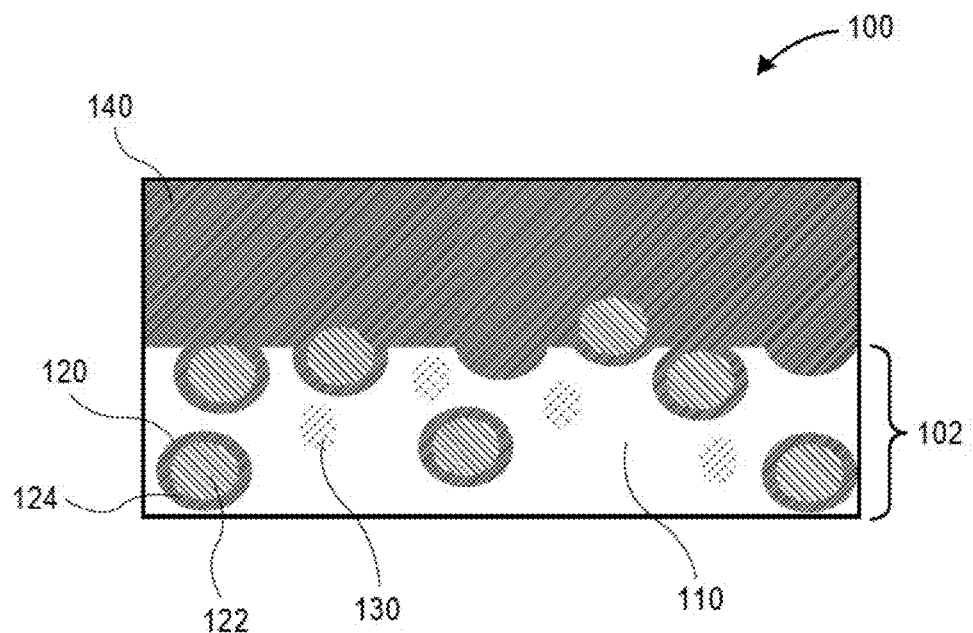

FIGS. 1A, 1B, and 1C illustrate cross-sectional views of a package substrate, in accordance with various embodiments. FIG. 1A illustrates a cross-sectional view of package substrate 100. Package substrate 100 may include build-up layer 102, which may also be referred at as a build-up film. Build-up layer 102 may include dielectric material 110, and one or more microspheres 120.

Dielectric material 110 may include or be composed of a material such as, for example, but not limited to, an Ajinomoto Build-up Film (ABF), a prepreg build-up film, an epoxy, a polymer, an epoxy-polymer blend, or any type of mold, dielectric, resist, reinforced, or laminate type film that may have various properties including but not limited to, for example, low dielectric loss, low coefficient of thermal expansion (CTE), high thermal conductivity, high mechanical stability, or some other type of appropriate property. Dielectric material 110 may be an organic dielectric material, such as, for example, but not limited to, an epoxy-based dielectric. In an embodiment, dielectric material 110 may be at least partially cured. In another embodiment, dielectric material 110 may be uncured until being laminated onto a package substrate. Thus, while FIG. 1A depicts build-up layer 102 as having a shape, it may be fluid until a certain phase of processing. Dielectric material 110 may be formed by any applicable process, including, but not limited to, for example, doping, co-deposition, and the like.

Build-up layer 102 may further include one or more microspheres 120, which may be referred to as microspheres or may be referred to as a microsphere. Microspheres 120 may include a core 122 that may include a first material. In an embodiment, the first material may be a magnetic material, and core 122 may be referred to as a magnetic core. In an embodiment, the first material may be a polymer that may include or may contain iron, which may be referred to as an Fe-containing polymer, or the first material may be soft material other than an Fe-containing polymer. The polymer may be, for example, but is not limited to, a polyimide, polyester, polyphenol, or poly cyclic-olefin. In an embodiment, the first material may be a pure metal. In another embodiment, the first material may be a metal alloy. In an embodiment, the first material may be a pure metal that is a noble metal or a metal alloy that has properties of a noble metal, in that the first material may be resistant to oxidation or resistant to corrosion. In an embodiment, the first material may be referred to as a non-oxidation material, or a non-oxidation metal, or an oxidation-resistant material, or an oxidation-resistant metal. The first material may be, for example, but is not limited to, cobalt-tantalum-zirconium (CoTaZr), neodymium-iron-carbon (NdFeC), which may also be referred to as iron oxide neodymium, cobalt-iron-carbon (CoFeC), iron, cobalt, or nickel. In an embodiment, core 122 may have a diameter of from about 100 nanometers to about 5 micrometers.

Microspheres 120 may further include shell 124 to encapsulate core 122. Accordingly, microspheres 120 may be referred to as core-shell particles. Shell 124 may include a second material. In an embodiment, the second material may be an inert material, where the second material may be inert to oxidation or may be chemically inactive. For example, the second material may be chemically inactive in the presence of chemicals that may be used in the processing of build-up layer 102 and does not oxide in the presence of such chemicals. Further, in an embodiment, the second material may be highly passivating, in that the presence of shell 124 may cause microspheres 120 that include core 122 to be unreactive in the presence of such chemicals. For example, the second material may prevent, eliminate, reduce, or mitigate the oxidation of microspheres 120 that include core 122. Such chemicals may include, for example, but are not limited to, hydrogen peroxide, sodium persulfate, permanganate solution, hydroxylamine, sulfuric acid, or formic acid. In an embodiment, the second material may be referred to as a non-oxidation material or an oxidation-resistant material. In an embodiment, the first material of core 122 may be referred to as a first oxidation-resistant material and the second material of shell 124 may be referred to as a second oxidation-resistant material. In another embodiment, the first material of core 122 may be referred to as a first non-oxidation material and the second material of shell 124 may be referred to as a second non-oxidation material. The second material may be, for example, but is not limited to, copper, silver, gold, platinum, palladium, titanium, or chromium. In an embodiment, shell 124 may have a thickness of from about 10 nanometers to about 100 nanometers. In an embodiment, a surface of shell 124 may include a surface treatment that may be a polymer, such as, for example, but not limited to, a polyamine, a polythiolate, a polycarboxylate, or a polysilane, and thus may provide a polymer layer.

Although embodiments herein may include a microsphere 120 that may include a shell 124 to encapsulate a magnetic core 122 that may be a metal, a metal alloy, or an Fe-containing polymer, embodiments herein are not limited to a microsphere 120 that may include a magnetic core 122 that may be a metal, a metal alloy, or an Fe-containing polymer. For example, embodiments herein may include a microsphere 120 that may include a shell 124 to encapsulate a core that may be a material such as, for example, but not limited to silicon dioxide ($SiO_2$). FIG. 1B illustrates a cross-sectional view of build-up layer 102 that includes dielectric material 110 and microspheres 120.

Build-up layer 102 may further include a filler material 130. FIG. 1C illustrates package substrate 100 that includes build-up layer 102 that includes filler material 130. Filler material 130 may, for example, assist in the prevention or decrease of thermal expansion of build-up layer 102. In an embodiment, filler material 130 may be a silica filler material. The size of filler material 130 may be within a range that may vary based at least in part on, for example, desired viscosity of dielectric material 110, or desired spacing of metal layer 140 (metal layer 140 is described below.) In an embodiment, filler material 130 may have a maximum filler size of about 5 micrometers and an average filler size of less than about 0.5 micrometers. Although FIG. 1A shows a package substrate 100 that includes a build-up layer 102 that does not include filler material 130, embodiments herein may include a package substrate 100 that may include a build-up layer 102 that may include a composite film in place of dielectric material 110. In those embodiments, the composite film may include both dielectric material and filler material.

Package substrate 100 may further include a metal layer 140 coupled with build-up layer 102. In an embodiment, metal layer 140 may be copper. In another embodiment, metal layer 140 may be some other material such as, for example, but not limited to, aluminum or tungsten. Although a few examples of materials from which metal layer 140 may be formed are described here, any material that may serve as a metal layer in a semiconductor package may be used. Metal layer 140 may be applied to build-up layer 102 through electroless plating or electrolytic plating.

Accordingly, embodiments herein may include core-shell particles that may be used in dielectric material to provide both magnetic properties and a surface chemistry that may be compatible with chemical baths used during processing of build-up film or package substrates. The shells of the core-shell particles may passivate the core-shell particles from reactive chemical baths. The shells may also act as autocatalytic or seed sites for processes, such as, for example, but not limited to, electroless deposition of a metal layer. For example, a copper shell may be used to passivate a core-shell particle from chemical baths that may be designed for copper, and the high availability of copper surface sites provided by core-shell particles that have a copper shell may aid in electroless copper deposition on the surface of dielectric material that has a magnetic property due to the presence of the core-shell particles that include a copper shell. Thus, copper, for example, as a metal layer may deposit directly onto core-shell particles that may be exposed on the surface of the dielectric material, where these particles include a copper shell and may be partially embedded in the dielectric material. This may improve the peel strength of the interface between the dielectric material and the copper deposited on the surface of the dielectric material. The peel strength may refer to, for example, the strength of the bond between the dielectric material and the metal deposited on the surface of the dieletric material. The exposed surfaces of the core-shell particles may also function as an autocatalytic surface for deposition of the metal layer.

Thus, the microspheres described in embodiments herein may provide chemical compatibility with wet baths used during processing of build-up layers and may also provide improved adhesion of a metal layer to a dielectric material that includes microspheres described in embodiments herein. Further, a microsphere that includes a shell may be partially embedded in the surface of the dielectric material and may connect either electroless plated metal or electrolytic plated metal to the microsphere. For example, a microsphere that may include a copper shell may connect to either electroless plated copper or electrolytic plated copper, where the microsphere may be partially embedded in the surface of the dielectric material.

Although examples above may refer to copper as a shell of a core-shell particle included in a dielectric material, and may refer to copper as the metal deposited on the dielectric material, embodiments herein are not limited to copper shells and copper metal layers. Accordingly, the shells may be formed of any other material described herein as being suitable for a shell, such as, for example, but not limited to, silver, gold, platinum, palladium, titanium, or chromium, or any other material that may be suitable for a shell. Further, the metal layer deposited on the dielectric material that includes the core-shell particle may be any other material described herein that may be used for the metal layer, such as, for example, but not limited to, aluminum or tungsten, or any other material that may serve as a metal layer. In addition, the shell may be formed of a material and the metal layer may be formed of the same material as the shell, or the shell may be formed of a material and the metal layer may be formed of a different material than the shell.

Figure 2:
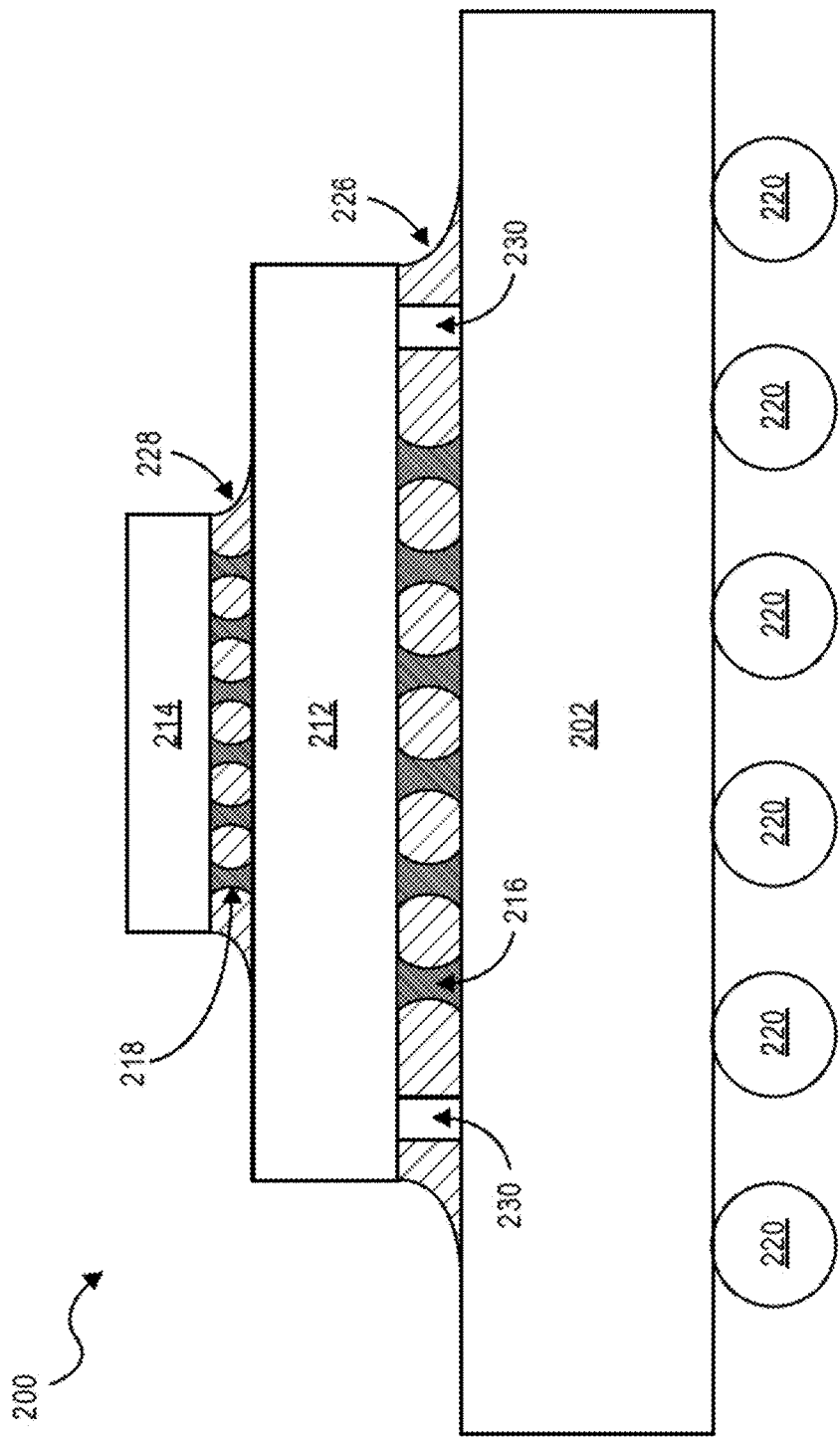
FIG. 2 illustrates a cross-sectional view of a semiconductor package, in accordance with various embodiments.

FIG. 2 illustrates a cross-sectional view of a semiconductor package, in accordance with various embodiments. Semiconductor package 200, which may also be referred to as a semiconductor packaged system, may include package substrate 212 that may include build-up layer 102 and metal layer 140 described herein, where build-up layer 102 includes a dielectric material 110 and one or more microspheres 120 that include a core 122 and a shell 124 described herein. Package substrate 212 (which may also be an interposer) may further include vias, traces, conductive layers, and dielectric layers.

Semiconductor package 200 may further include die 214, package substrate 202, interconnect structures (e.g., the plurality of bumps 216, 218, and 220 disposed below die 214, package substrate 212, and package substrate 202), and underfill layer(s) 226 and 228. Semiconductor package 200 is not limited to the illustrated semiconductor packaged system, and thus may be designed or formed with fewer, alternate, or additional packaging components and/or with different interconnecting structures. Further, semiconductor package 200 may include fewer or additional packaging components and/or materials based on the desired packaging design. Semiconductor package 200 is merely one example of an embodiment of a semiconductor packaged system.

In an embodiment, semiconductor package 200 may include a land grid array (LGA) package and/or a pin grid array (PGA) package. In an embodiment, die 214 (or an integrated circuit die) may be coupled to or coupled with package substrate 212 via one or more bumps/joints formed from respective microbumps. A solder joint formed by soldering of a microbump may itself be referred to as a "bump" and/or a "microbump." In another, embodiment, die 214, package substrate 212, and package substrate 202 may be coupled using anisotropic conductive film (ACF). In an embodiment, substrate package 200 may include a silicon interposer or a die having through silicon vias (TSVs).

In an embodiment, package substrate 202 may include, but is not limited to, a package, a substrate, a printed circuit board (PCB), and a motherboard. In an embodiment, package substrate 202 may be a PCB. In an embodiment, the PCB may be made of an FR-4 glass epoxy base with thin copper foil laminated on both sides. In an embodiment, a multilayer PCB may be used, with pre-preg and copper foil used to make additional layers. In an embodiment, holes may be drilled in the PCB. In an embodiment, the PCB may further include conductive layers that comprise copper lines/traces, metallic pads, vias, via pads, planes, and/or holes.

In an embodiment, die 214 may include, but is not limited to, a semiconductor die, an electronic device (e.g., a wireless device), an integrated circuit, a central processing unit (CPU), a microprocessor, a platform controller hub (PCH), a memory, and a field-programmable gate array (FPGA). Die 214 may be formed from a material such as silicon and have circuitry thereon that is to be coupled to or coupled with the package substrate 212. Although some embodiments are not limited in this regard, package substrate 202 may in turn be coupled to or coupled with another body, for example, a computer motherboard. One or more connections, e.g., including some or all of bumps 216, 218, and 220, between package substrate 202, package substrate 212, and die 214 may include one or more interconnect structures and underfill layers 226 and 228. In an embodiment, these interconnect structures (or connections) may variously comprise an alloy of nickel, palladium, and tin (and, in some embodiments, copper).

Connections between package substrate 202 and another body may be made using any suitable structure, such as the illustrative bumps 220 shown. The package substrate 202 may include a variety of electronic structures formed thereon or therein. Package substrate 212 may also include electronic structures formed thereon or therein, which may be used to couple die 214 to or with package substrate 202. In an embodiment, one or more different materials may be used for forming package substrate 202 and package substrate 212. In an embodiment, package substrate 202 may be an organic substrate made up of one or more layers of polymer base material, with conducting regions for transmitting signals. In an embodiment, package substrate 212 may be made up of a ceramic base material including metal regions for transmitting signals.

Although some embodiments are not limited in this regard, semiconductor package 200 may include gap control structures 230, e.g., positioned between package substrate 202 and package substrate 212. Such gap control structures 230 may mitigate a change in the height of the gap between package substrate 202 and package substrate 212, which otherwise might occur during reflowing while die 214 is attached to package substrate 212. Semiconductor package 200 may include underfill layer 228 between package substrate 212 and die 214, and underfill layer 226 between package substrate 202 and package substrate 212. In an embodiment, underfill layers/materials 226 and 228 may include one or more polymers that may be injected between the layers. In another embodiment, underfill layer(s) 226 and 228 may be molded underfill(s) (MUF(s)).

Figure 3:
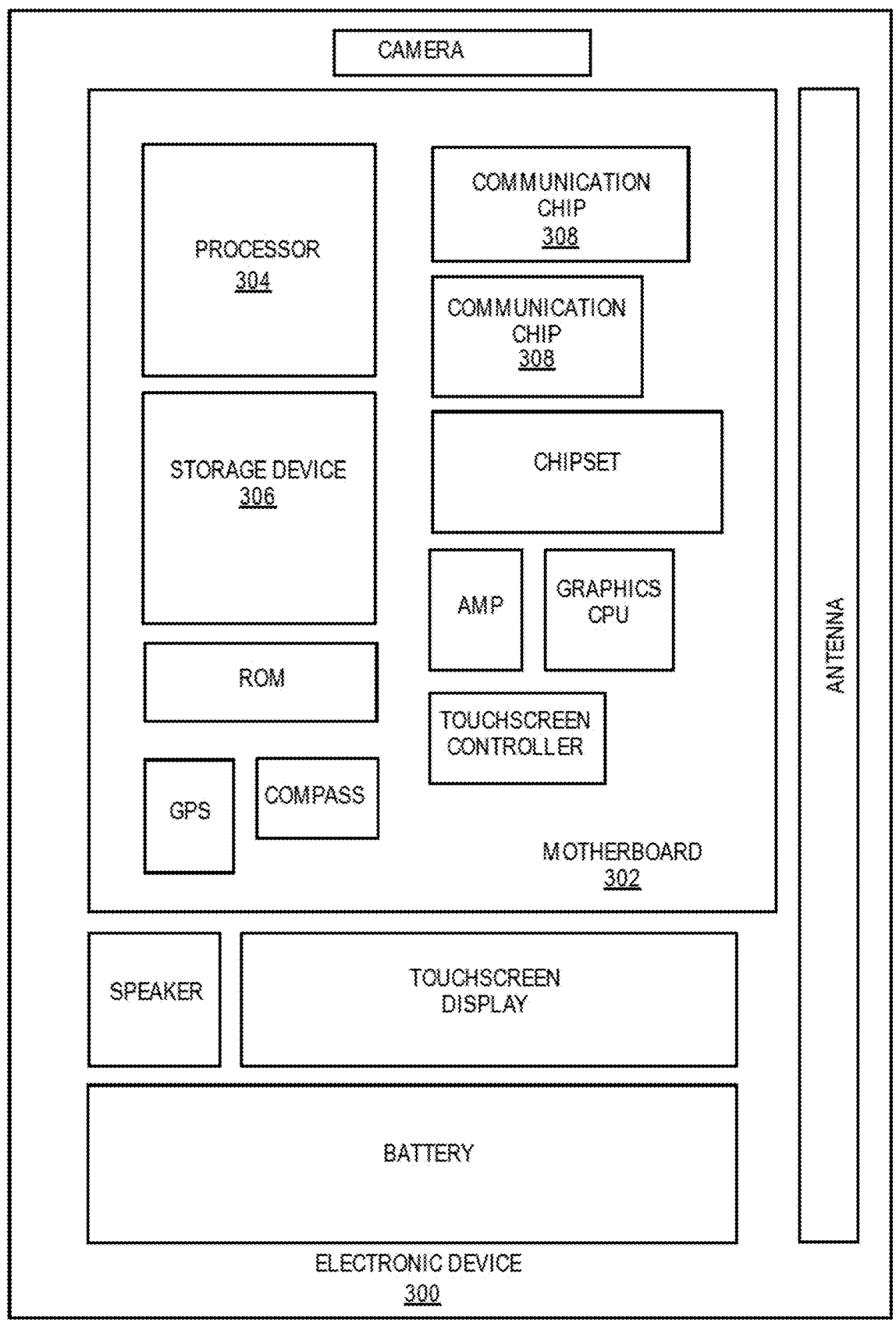
FIG. 3 illustrates an example electronic device, in accordance with various embodiments.

FIG. 3 illustrates an example electronic device 300, in accordance with various embodiments. Electronic device 300 may be, for example, a mobile communication device or a desktop or rack-based electronic device. The electronic device 300 may include a board such as board 302. Board 302 may include package substrate 100. Board 302 may include a number of components, including, but not limited to, a processor 304, a storage device 306, and at least one communication chip 308. Any of the components discussed herein with reference to the electronic device 300 may include package substrate 100. For example, the package substrate 100 may be part of a component such as a processor, a memory, a storage device, a system on chip (SoC), or an element thereof such as an interposer, a patch, and/or a die. Further, electronic device 300 may include a semiconductor package, such as, for example, but not limited to, semiconductor package 200 that includes various embodiments of package substrate 100, and a die coupled with package substrate 100.

Depending on its applications, computing system 300 may include one or more other components that may or may not be physically and electrically coupled to the board 302. These other components may include, but are not limited to, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The processor 304 of the electronic device 300 may include one or more devices in accordance with various embodiments described herein. The term "processor" may refer to any device or portion of a device that processes electronic data from registers and/or memory to transform that electronic data into other electronic data that may be stored in registers and/or memory.

The electronic device 300 may include a storage device 306. In some embodiments, the storage device 306 may include one or more solid state drives. Examples of storage devices that may be included in the storage device 306 include, but are not limited to, volatile memory (e.g., dynamic random access memory (DRAM)), non-volatile memory (e.g., read-only memory, ROM), flash memory, and mass storage devices (such as hard disk drives, compact discs (CDs), digital versatile discs (DVDs), and so forth).

The communication chip 308 and the antenna may enable wireless communications for the transfer of data to and from the electronic device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 308 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wide region (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 308 may operate in accordance with a Global System for Mobile Communications (GSM), General Packet Radio Service (GPRS), Universal Mobile Telecommunications System (UMTS), High Speed Packet Access (HSPA), Evolved HSPA (E-HSPA), or LTE network. The communication chip 308 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 308 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 308 may operate in accordance with other wireless protocols in other embodiments.

The electronic device 300 may include a plurality of communication chips 308. For instance, a first communication chip 308 may be dedicated to shorter range wireless communications such as Wi-Fi and Bluetooth, and a second communication chip 308 may be dedicated to longer range wireless communications such as GPS, EDGE, GPRS, CDMA, WiMAX, LTE, EV-DO, and others. In some embodiments, the communication chip 308 may support wired communications. For example, the electronic device 300 may include one or more wired servers.

The processor 304 and/or the communication chip 308 of the electronic device 300 may include one or more dies or other components in an IC package. Such an IC package may be coupled with an interposer or another package using any of the techniques disclosed herein. The term "processor" may refer to any device or portion of a device that processes electronic data from registers and/or memory to transform that electronic data into other electronic data that may be stored in registers and/or memory.

In various implementations, the electronic device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the electronic device 300 may be any other electronic device that processes data. In some embodiments, the recessed conductive contacts disclosed herein may be implemented in a high-performance electronic device.

Some non-limiting examples are provided below.

EXAMPLES

Example 1 may include a package substrate, comprising: a build-up layer comprising: a dielectric material; and one or more microspheres, wherein the one or more microspheres include a magnetic core that includes a first material that is a first oxidation-resistant material, wherein the one or more microspheres include a shell to encapsulate the core, and wherein the shell includes a second material that is a second oxidation-resistant material; and a metal layer coupled with the build-up layer.

Example 2 may include the package substrate of Example 1 or some other example herein, wherein the package substrate of claim 1, wherein the first material is cobalt-tantalum-zirconium, neodymium-iron-carbon, or cobalt-iron-carbon.

Example 3 may include the package substrate of Example 1 or some other example herein, wherein the first material is iron, cobalt, or nickel.

Example 4 may include the package substrate of Example 1 or some other example herein, wherein the first material is a polymer that includes iron, and wherein the polymer is a polyimide, polyester, polyphenol, or poly cyclic-olefin.

Example 5 may include the package substrate of Example 1, 2, 3, 4, or some other example herein, wherein the second material is copper, silver, gold, platinum, palladium, titanium, or chromium.

Example 6 may include the package substrate of Example 1, 2, 3, 4, or some other example herein, wherein the build-up layer further comprises silica filler material.

Example 7 may include the package substrate of Example 1, 2, 3, 4, or some other example herein, wherein the metal layer is copper, tungsten, or aluminum.

Example 8 may include a build-up layer, comprising: a dielectric material; and one or more microspheres, wherein the one or more microspheres include a magnetic core that includes a first material that is a first oxidation-resistant material, wherein the one or more microspheres include a shell to encapsulate the core, and wherein the shell includes a second material that is a second oxidation-resistant material.

Example 9 may include the build-up layer of Example 8 or some other example herein, wherein the first material is cobalt-tantalum-zirconium, neodymium-iron-carbon, or cobalt-iron-carbon.

Example 10 may include the build-up layer of Example 8 or some other example herein, wherein the first material is iron, cobalt, or nickel.

Example 11 may include the build-up layer of Example 8 or some other example herein, wherein the first material is a polymer that includes iron, and wherein the polymer is a polyimide, polyester, polyphenol, or poly cyclic-olefin.

Example 12 may include the build-up layer of Example 8, 9, 10, 11, or some other example herein, wherein the second material is copper, silver, gold, platinum, palladium, titanium, or chromium.

Example 13 may include the build-up layer of Example 8, 9, 10, 11, or some other example herein, wherein the core has a diameter of from about 100 nanometers to about 5 micrometers.

Example 14 may include the build-up layer of Example 8, 9, 10, 11, or some other example herein, wherein the shell has a thickness of from about 10 nanometers to about 100 nanometers.

Example 15 may include the build-up layer of Example 8, 9, 10, 11, or some other example herein, wherein a surface of the shell includes a surface treatment, and wherein the surface treatment is a polyamine, a polythiolate, a polycarboxylate, or a polysilane.

Example 16 may include the build-up layer of Example 8, 9, 10, 11, or some other example herein, wherein the build-up layer further comprises silica filler material.

Example 17 may include a semiconductor package, comprising: a package substrate, comprising: a build-up layer comprising: a dielectric material; and one or more microspheres, wherein the one or more microspheres include a magnetic core that includes a first material that is a first oxidation-resistant material, wherein the one or more microspheres include a shell to encapsulate the core, and wherein the shell includes a second material that is a second oxidation-resistant material; and a metal layer coupled with the build-up layer; and a die coupled with the package substrate.

Example 18 may include the semiconductor package of Example 17 or some other example herein, wherein the first material is cobalt-tantalum-zirconium, neodymium-iron-carbon, or cobalt-iron-carbon, iron, cobalt, nickel, or a polymer that includes iron.

Example 19 may include the semiconductor package of Example 17, 18, or some other example herein, wherein the second material is copper, silver, gold, platinum, palladium, titanium, or chromium.

Example 20 may include the semiconductor package of Example 17, 18, or some other example herein, wherein the metal layer is copper, tungsten, or aluminum.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A package substrate, comprising:
   a build-up layer comprising:
      a dielectric material; and
      a plurality of microspheres in the dielectric material, wherein the plurality of microspheres include a magnetic core that includes a first material that is a first oxidation-resistant material, wherein the first material is neodymium-iron-carbon or cobalt-iron-carbon, wherein the one or more microspheres include a shell to encapsulate the core, wherein the shell includes a second material that is a second oxidation-resistant material, and wherein a portion of the plurality of microspheres protrudes from a surface of the dielectric material; and
   a metal layer coupled with the build-up layer, wherein the metal layer comprises copper in direct contact with the portion of the plurality of microspheres that protrudes from a surface of the dielectric material.

2. The package substrate of claim 1, wherein the first material is iron, cobalt, or nickel.

3. The package substrate of claim 1, wherein the first material is a polymer that includes iron, and wherein the polymer is a polyimide, polyester, polyphenol, or poly cyclic-olefin.

4. The package substrate of claim 1, wherein the second material is copper, silver, gold, platinum, palladium, titanium, or chromium.

5. The package substrate of claim 1, wherein the build-up layer further comprises silica filler material.

6. A semiconductor package, comprising:
   a package substrate, comprising:
      a build-up layer comprising:
         a dielectric material; and
         a plurality of microspheres in the dielectric material, wherein the plurality of microspheres include a magnetic core that includes a first material that is a first oxidation-resistant material, wherein the first material is neodymium-iron-carbon or cobalt-iron-carbon, wherein the one or more microspheres include a shell to encapsulate the core, and wherein the shell includes a second material that is a second oxidation-resistant material, and wherein a portion of the plurality of microspheres protrudes from a surface of the dielectric material; and
      a metal layer coupled with the build-up layer, wherein the metal layer comprises copper in direct contact with the portion of the plurality of microspheres that protrudes from a surface of the dielectric material; and
   a die coupled with the package substrate.

7. The semiconductor package of claim 6, wherein the second material is copper, silver, gold, platinum, palladium, titanium, or chromium.

* * * * *